United States Patent
Ebina et al.

(10) Patent No.: US 6,518,124 B1
(45) Date of Patent: Feb. 11, 2003

(54) METHOD OF FABRICATING SEMICONDUCTOR DEVICE

(75) Inventors: Akihiko Ebina, Suwa (JP); Susumu Inoue, Suwa (JP)

(73) Assignees: Seiko Epson Corporation, Tokyo (JP); Halo LSI Design & Device Technology, Inc., Wappingers Falls, NY (US)

( * ) Notice: Subject to any disclaimer, the term of this patent is extended or adjusted under 35 U.S.C. 154(b) by 0 days.

(21) Appl. No.: 09/953,855

(22) Filed: Sep. 18, 2001

(51) Int. Cl.$^7$ .............................................. H01L 21/336
(52) U.S. Cl. ...................... 438/257; 438/258; 438/418
(58) Field of Search ................................. 257/345, 346, 257/347; 438/149, 257, 258, 267, 286, 300, 350, 418, 517, 584, 587

(56) References Cited

U.S. PATENT DOCUMENTS

| | | |
|---|---|---|
| 5,408,115 A | 4/1995 | Chang |
| 5,422,504 A | 6/1995 | Chang et al. |
| 5,494,838 A | 2/1996 | Chang et al. |
| 5,969,383 A | 10/1999 | Chang et al. |
| 6,177,318 B1 | 1/2001 | Ogura et al. |
| 6,248,633 B1 | 6/2001 | Ogura et al. |
| 6,255,166 B1 | 7/2001 | Ogura et al. |
| 6,413,821 B1 * | 9/2001 | Ebina et al. |

OTHER PUBLICATIONS

Hayashi, Yutaka et al., "Twin MONOS Cell with Dual Control Gates", *2000 IEEE Symposium on VLSI Technology Digest of Technical Papers*.

Chang, Kuo–Tung et al., "A New SONOS Memory Using Source–Side Injection for Programming", *1998 IEEE Electron Device Letters*, vol. 19, No. 7, Jul. 1998, pp. 253–255.

Chen, Wei–Ming et al., "A Novel Flash Memory Device with SPlit Gate Source Side Injection an ONO Charge Storage Stack (SPIN)", *1997 Symposium on VLSI Technology Digest of Technical Papers*, pp. 63–64.

\* cited by examiner

*Primary Examiner*—Michael Sherry
*Assistant Examiner*—Lisa Kilday
(74) *Attorney, Agent, or Firm*—Oliff & Berridge, PLC (57) ABSTRACT

A method of fabricating a semiconductor device including the following steps of: forming a first insulating layer, a first conductive layer and a stopper layer over a semiconductor layer; forming a mask insulating layer on the first conductive layer in a logic circuit region; forming a conductive layer in a formation region of word gate layers and common contact sections and forming gate electrodes; anisotropically etching the second conductive layer to form control gates in the shape of sidewalls and a conductive layer of the common contact sections, in a memory region; and patterning the third conductive layer and the first conductive layer to form word gates and word lines.

4 Claims, 10 Drawing Sheets

METHOD OF FABRICATING SEMICONDUCTOR DEVICE

FIELD OF THE INVENTION

The present invention relates to a method of fabricating a semiconductor device including a logic circuit region and a memory region in which nonvolatile memory devices having two charge storage regions for one word gate are arranged in a matrix.

BACKGROUND OF THE INVENTION

As one type of nonvolatile semiconductor memory device, a MONOS (Metal Oxide Nitride Oxide Semiconductor) or SONOS (Silicon Oxide Nitride Oxide Silicon) memory device is known. In the MONOS or SONOS memory device, a gate insulating layer between a channel region and a control gate is formed of a laminate consisting of a silicon oxide layer and a silicon nitride layer, and charges are trapped in the silicon nitride layer.

Figure 15:
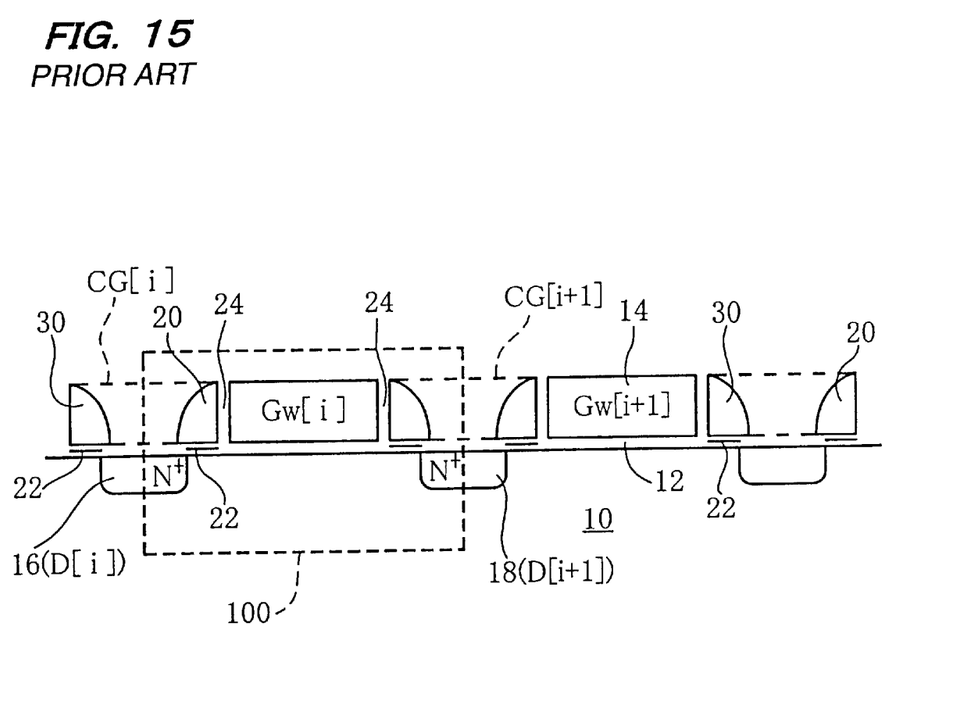
FIG. 15 is a cross-sectional view showing a conventional MONOS memory cell.

A device shown in FIG. 15 is known as such a MONOS nonvolatile semiconductor memory device (Y. Hayashi, et al., 2000 *Symposium on VLSI Technology Digest of Technical Papers*, 122–123).

In this MONOS memory cell 100, a word gate 14 is formed on a semiconductor substrate 10 with a first gate insulating layer 12 interposed. A first control gate 20 and a second control gate 30 are disposed on either side of the word gate 14 in the shape of sidewalls. A second insulating layer 22 is present between the bottom of the first control gate 20 and the semiconductor substrate 10. An insulating layer 24 is present between the side of the first control gate 20 and the word gate 14. Another second gate insulating layer 22 is present between the bottom of the second control gate 30 and the semiconductor substrate 10. Another insulating layer 24 is present between the side of the second control gate 30 and the word gate 14. Impurity layers 16 and 18 forming a source region or a drain region are formed in the semiconductor substrate 10 in a region between the control gate 20 and the control gate 30 facing each other in the adjacent memory cells.

As described above, one memory cell 100 includes two MONOS memory elements, one on each side of the word gate 14. These two MONOS memory elements can be controlled separately. Therefore, one memory cell 100 is capable of storing two bits of information.

BRIEF SUMMARY OF THE INVENTION

An objective of the present invention is to provide a method of fabricating a semiconductor device including MONOS nonvolatile memory devices each of which has two charge storage regions, in which a memory region including MONOS memory cells and a logic circuit region including a peripheral circuit for the memory and the like are formed on a single substrate.

According to the present invention, there is provided a method of fabricating a semiconductor device including: a memory region which has nonvolatile memory devices; and a logic circuit region which has a peripheral circuit for the nonvolatile memory devices. This method includes the following steps in this order:

a step of forming a first insulating layer over a semiconductor layer;

a step of forming a first conductive layer over the first insulating layer;

a step of forming a mask insulating layer over part of the first conductive layer disposed within the logic circuit region;

a step of forming a stopper layer over the first conductive layer and the mask insulating layer;

a step of etching part of the stopper layer, the mask insulating layer and the first conductive layer to form word gate layers in the memory region and to form gate electrodes of insulated-gate field-effect transistors in the logic circuit region;

a step of forming an ONO film over the entire surface of the memory region and the logic circuit region;

a step of forming a second conductive layer over the ONO film;

a step of anisotropically etching the second conductive layer to form control gates in the shape of sidewalls at least on both sides of each of the word gate layers in the memory region with the ONO film interposed;

a step of forming first impurity layers each of which forms a source region or a drain region of the nonvolatile memory devices, and forming second impurity layers each of which forms a source region or a drain region of the insulated-gate field-effect transistors;

a step of forming sidewall insulating layers at least on both sides of the gate electrodes;

a step of forming silicide layers on the surfaces of the first impurity layers and the second impurity layers;

a step of forming a second insulating layer over the entire surface of the memory region and the logic circuit region;

a step of polishing the second insulating layer to expose the stopper layer;

a step of removing the stopper layer; and a step of patterning the word gate layers in the memory region to form word gates of the nonvolatile memory devices in the memory region.

DETAILED DESCRIPTION OF THE EMBODIMENT

An embodiment of the present invention is described below with reference to the drawings. Before describing the fabrication method according to the embodiment of the present invention, a semiconductor device obtained by this fabrication method is described below.

Figure 1:
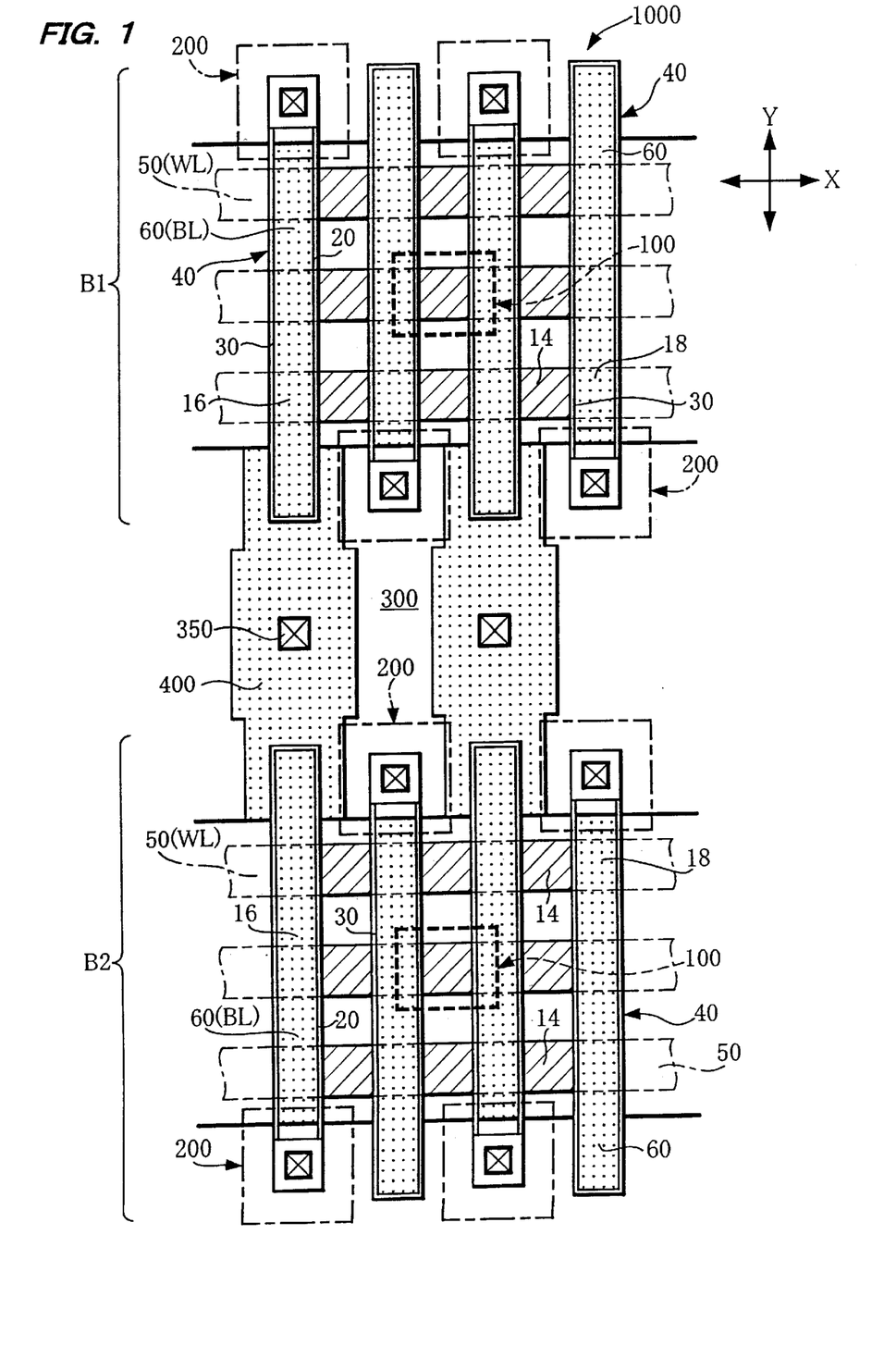
FIG. 1 is a plan view schematically showing a layout of a memory region of a semiconductor device according to an embodiment of the present invention.
Figure 2:
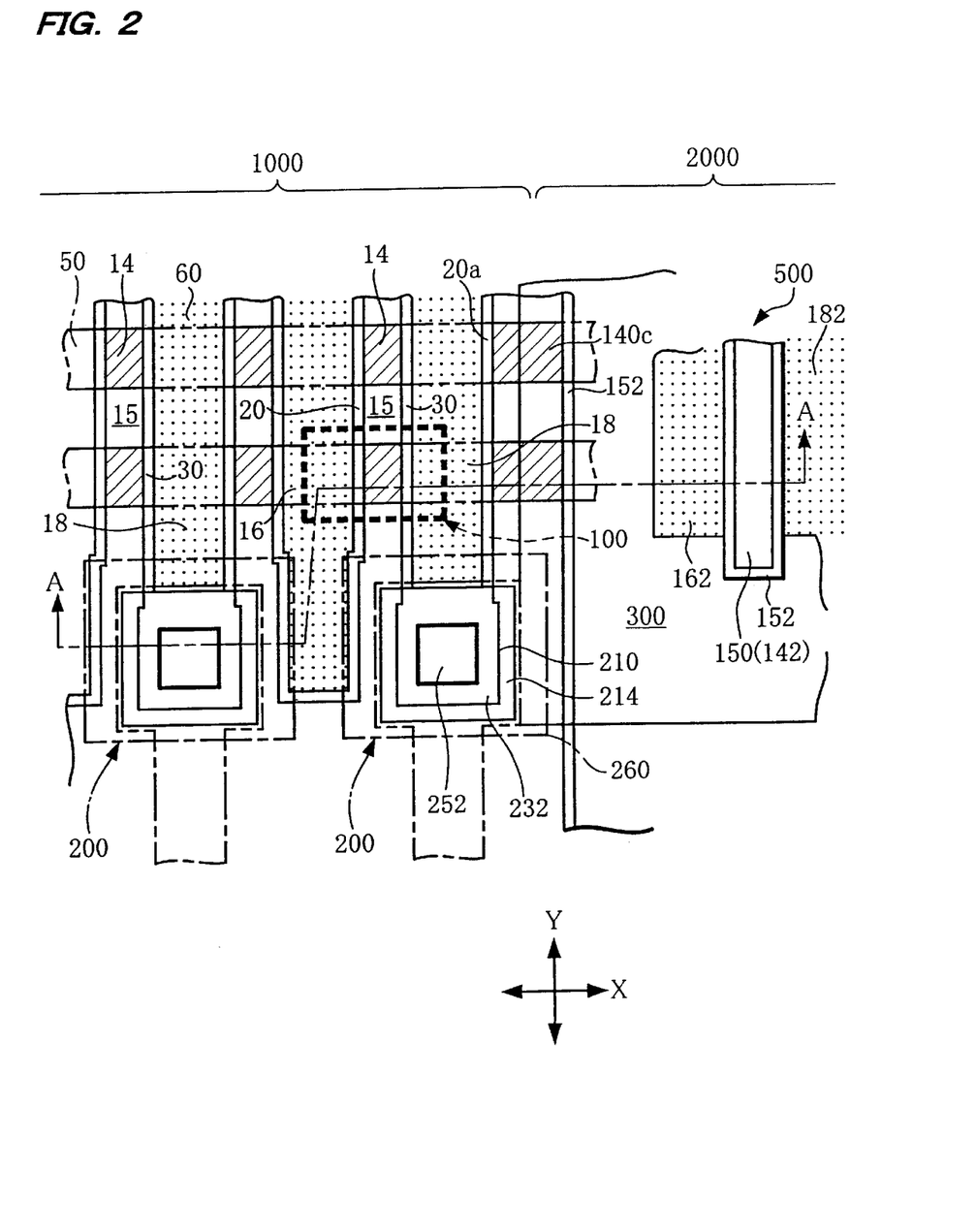
FIG. 2 is a plan view schematically showing a part of the semiconductor device according to the embodiment of the present invention.
Figure 3:
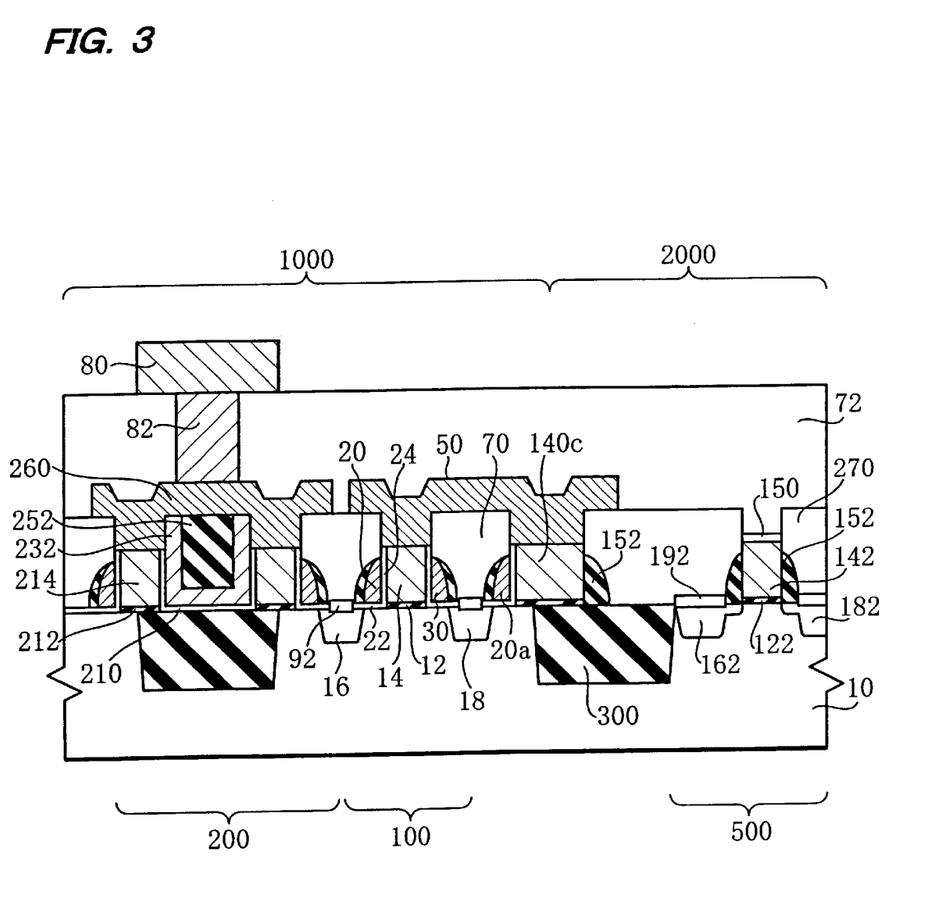
FIG. 3 is a cross-sectional view schematically showing a section taken along the line A—A in FIG. 2.

FIG. 1 is a plan view showing a layout of a memory region of the semiconductor device. FIG. 2 is a plan view showing part of the semiconductor device according to the embodiment of the present invention. FIG. 3 is a cross-sectional view taken along the line A—A shown in FIG. 2.

The semiconductor device shown in FIGS. 1 to 3 includes a memory region 1000 in which MONOS nonvolatile memory devices (hereinafter called "memory cells") 100 are arranged in a matrix with a plurality of rows and columns to make up a memory cell array, and a logic circuit region 2000 including a peripheral circuit for the memory and the like.

Device Structure

The layout of the memory region 1000 is described below with reference to FIG. 1.

FIG. 1 shows a first block B1 and a second block B2 adjacent thereto which are part of the memory region 1000. Element isolation regions 300 are formed in part of the region between the first block B1 and the second block B2. In each of the blocks B1 and B2, a plurality of word lines 50 (WL) extending in the X direction (or row direction) and a plurality of bit lines 60 (BL) extending in the Y direction (or column direction) are provided. One word line 50 is connected to a plurality of word gates 14 extending in the X direction. The bit lines 60 are formed by impurity layers 16 and 18.

The conductive layers 40 which form first and second control gates 20 and 30 are formed so as to enclose each of the impurity layers 16 and 18. Specifically, each of the first and second control gates 20 and 30 extends in the Y direction. The end sections of a pair of first and second control gates 20 and 30 are connected on one side through the conductive layer extending in the X direction. The other end sections of the pair of first and second control gates 20 and 30 are connected to one common contact section 200. Therefore, each of the first and second control gates 20 and 30 has a function of a control gate for the memory cells and a function of interconnection which connects each control gate arranged in the Y direction.

Each memory cell 100 includes one word gate 14, the first and second control gates 20 and 30 formed on either side of the word gate 14, and the impurity layers 16 and 18 formed in a semiconductor substrate outside the control gates 20 and 30. The adjacent memory cells 100 share the impurity layers 16 and 18.

The impurity layer 16 formed in the block B1 and the impurity layer 16 formed in the block B2 adjacent in the Y direction are electrically connected through a contact impurity layer 400 formed in the semiconductor substrate. The contact impurity layer 400 and the common contact section 200 for the control gates are on the opposite sides of the same impurity layer 16.

Contacts 350 are formed on the contact impurity layers 400. The bit lines 60 formed by the impurity layers 16 are electrically connected with upper interconnect layers through the contacts 350.

Two impurity layers 18 adjacent to each other in the Y direction are electrically connected through a contact impurity layer (not shown) on the side on which the common contact section 200 is not disposed.

As shown in FIG. 1, the common contact sections 200 in one block are arranged on alternate sides of impurity layers 16 and 18. The contact impurity layers 400 in one block are also arranged on alternate sides of the impurity layers 16 and 18.

The planar structure and the cross-sectional structure of the semiconductor device are described below with reference to FIGS. 2 and 3. The logic circuit region 2000 which includes a peripheral circuit for the memory, for example, is provided at a position adjacent to the memory region 1000. The memory region 1000 and the logic circuit region 2000 are electrically isolated by an element isolation regions 300. At least the memory cells 100 are formed in the memory region 1000. At least insulated-gate field-effect transistors (hereinafter called "MOS transistors") 500 which make up a logic circuit are formed in the logic circuit region 2000.

The memory region 1000 is described below.

The memory cell 100 includes: the word gate 14 formed over a semiconductor substrate 10 with a first gate insulating layer 12 interposed; the impurity layers 16 and 18 formed in the semiconductor substrate 10 to form either a source region or a drain region; and the first and second control gates 20 and 30 in the shape of sidewalls formed along either side of the word gate 14. Silicide layers 92 are formed on the impurity layers 16 and 18.

The first control gate 20 is disposed over the semiconductor substrate 10 with a second gate insulating layer 22 interposed and also on one side of the word gate 14 with a side insulating layer 24 interposed. Similarly, the second control gate 30 is disposed over the semiconductor substrate 10 with the second gate insulating layer 22 interposed and also on the other side of the word gate 14 with the side insulating layer 24 interposed.

The second gate insulating layer 22 and the side insulating layer 24 are ONO films. Specifically, the second gate insulating layer 22 and the side insulating layer 24 are laminated films consisting of a bottom silicon oxide layer (first silicon oxide layer), a silicon nitride layer, and a top silicon oxide layer (second silicon oxide layer).

The first silicon oxide layer of the second gate insulating layer 22 forms a potential barrier between a channel region and a charge storage region. The silicon nitride layer of the second gate insulating layer 22 functions as a charge storage region in which carriers (electrons, for example) are trapped. The second silicon oxide layer of the second gate insulating layer 22 forms a potential barrier between the control gate and the charge storage region.

The side insulating layer 24 electrically isolates the word gate 14 from the control gates 20 and 30. The upper end of the side insulating layer 24 is located at a position higher than the upper ends of the control gates 20 and 30 with respect to the semiconductor substrate 10 in order to prevent short circuits between the word gate 14 and the first and second control gates 20 and 30.

The side insulating layer 24 and the second gate insulating layer 22 are formed in the same deposition step and have the same layer structure.

In the adjacent memory cells 100, a buried insulating layer 70 is formed between the first control gate 20 and the second control gate 30 adjacent to each other. The buried insulating layer 70 covers the control gates 20 and 30 so that at least the control gates 20 and 30 are not exposed. Specifically, the upper surface of the buried insulating layer 70 is located at a position higher than the upper end of the side insulating layer 24 with respect to the semiconductor substrate 10. The first and second control gates 20 and 30 can be electrically isolated from the word gate 14 and the word line 50 more reliably by forming the buried insulating layer 70 in this manner.

Conductive layers for supplying a specific potential to the control gates 20 and 30 are formed in the common contact sections 200. A first contact insulating layer 212, second contact insulating layer 210, first contact conductive layer 214, second contact conductive layer 232, third contact insulating layer 252, and third contact conductive layer 260 make up the common contact section 200.

The first contact insulating layer 212 is formed in the same step as the first gate insulating layer 12.

The second contact insulating layer 210 is formed in the same step as the second gate insulating layer 22 and the side insulating layer 24. Therefore, the second contact insulating layer 210 is formed of a laminate consisting of the first silicon oxide layer, the silicon nitride layer, and the second silicon oxide layer.

The first contact conductive layer 214 is formed in the same step as the word gate 14. The first contact conductive layer 214 is formed outside the second contact insulating layer 210.

The second contact conductive layer 232 is formed inside the second contact insulating layer 210. The second contact conductive layer 232 is formed in the same step as the first and second control gates 20 and 30 so as to be continuous with the control gates 20 and 30. Therefore, the second contact conductive layer 232 and the control gates 20 and 30 are formed of the same material.

The third contact insulating layer 252 is formed inside the second contact conductive layer 232. The third contact insulating layer 252 is formed in the same step as a sidewall insulating layer 152.

The third contact conductive layer 260 is formed in the same step as the word line 50 and connected with the first contact conductive layer 214 and the second contact conductive layer 232.

The MOS transistor 500 is formed in the logic circuit region 2000. The MOS transistor 500 includes a gate electrode 142 formed over the semiconductor substrate 10 with a third gate insulating layer 122 interposed, impurity layers 162 and 182 formed in the semiconductor substrate 10 which form either a source region or a drain region, and sidewall insulating layers 152 formed along both sides of the gate electrode 142. Silicide layers 192 are formed on the upper side of the impurity layers 162 and 182. A mask insulating layer 150 is formed on the upper side of the gate electrode 142.

The MOS transistor 500 is covered with an insulating layer 270 in the logic circuit region 2000. The insulating layer 270 is formed in the same step as the buried insulating layer 70.

A boundary section 140c is formed of the same material as the word gate 14 and the gate electrode 142 in the boundary region between the memory region 1000 and the logic circuit region 2000, as shown in FIGS. 2 and 3. The boundary section 140c is formed in the same deposition step as the word gate 14 and the gate electrode 142. At least part of the boundary section 140c is formed over the element isolation region 300.

A conductive layer 20a in the shape of a sidewall is formed of the same material as the control gates 20 and 30 on one side of the boundary section 140c (on the side of memory region 1000).

This conductive layer 20a in the shape of a sidewall extends in the Y direction and is electrically connected to the control gate 30 which is adjacent to the conductive layer 20a with the common contact section 200 interposed. The conductive layer 20a in the shape of a sidewall is not used as a control gate for memory cells. However, electrical characteristics of the control gate 30 adjacent to the conductive layer 20a can be made equal to electrical characteristics of other control gates by electrically connecting the sidewall conductive layer 20a with the control gate 30 adjacent thereto.

Another insulating layer 152 in the shape of a sidewall is formed in the same step as the sidewall insulating layer 152 of the MOS transistor 500 and provided on the other side of the boundary section 140c (on the side of logic circuit region 2000).

An interlayer dielectric 72 is formed on the semiconductor substrate 10 on which the memory cells 100, the MOS transistors 500, and the like are formed. A contact hole which reaches the third contact conductive layer 260 in the common contact section 200, for example, is formed in the interlayer dielectric 72. The contact hole is filled with a conductive layer 82 such as a tungsten plug or copper plug. The conductive layer 82 is connected with an interconnect layer 80 formed on the interlayer dielectric 72.

Fabrication Method of Semiconductor Device

The method of fabricating a semiconductor device according to the embodiment of the present invention is described below with reference to FIGS. 4 to 14. Each cross-sectional view corresponds to the components taken along the line A—A shown in FIG. 2. In FIGS. 4 to 14, components that are the same as those in FIGS. 1 to 3 are denoted by the same reference numbers and further description thereof is omitted.

Figure 4:
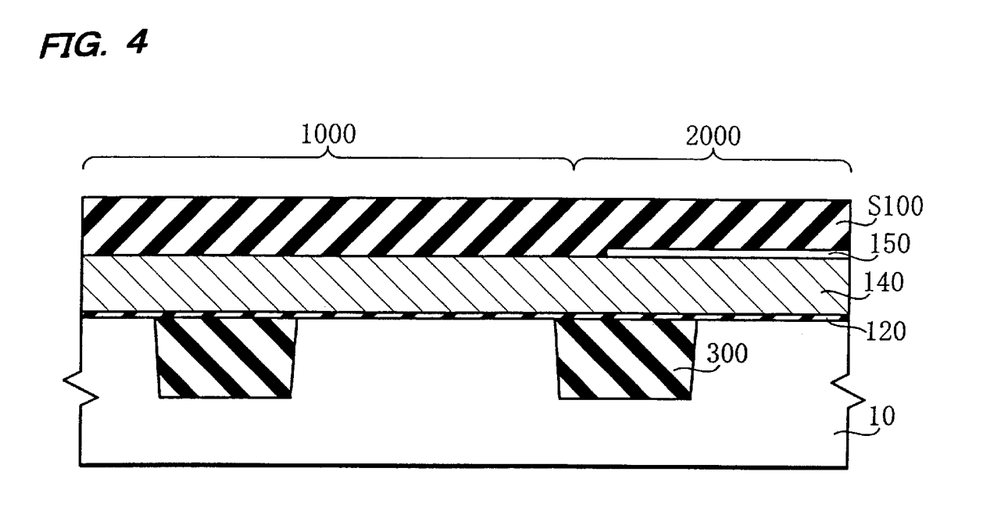
FIG. 4 is a cross-sectional view showing a step in a method of fabricating the semiconductor device shown in FIGS. 1 to 3.

(1) The element isolation regions 300 are formed on the surface of the semiconductor substrate 10 by the trench isolation process, as shown in FIG. 4. The contact impurity layers 400 (see FIG. 1) are formed in the semiconductor substrate 10 by ion implantation.

An insulating layer 120 and a gate layer 140 formed of doped polysilicon are formed on the surface of the semiconductor substrate 10. A mask insulating layer 150 is then formed in the logic circuit region 2000. The mask insulating layer 150 may be deposited and patterned by a conventional method. A stopper layer S100 used in a chemical mechanical polishing (CMP) process described later is formed in the memory region 1000 and the logic circuit region 2000.

A silicon nitride layer or the like may be used as the stopper layer S100. The mask insulating layer 150 must function as a mask for protecting the gate electrodes in the logic circuit region 2000 at least during a step of removing the stopper layer S100 and a step of etching the conductive layer described later. Therefore, in the case of using a silicon nitride layer as the stopper layer S100, a material used to remove the silicon nitride layer such as a silicon oxide layer exhibiting resistance to thermal phosphoric acid maybe used for the mask insulating layer 150.

Figure 5:
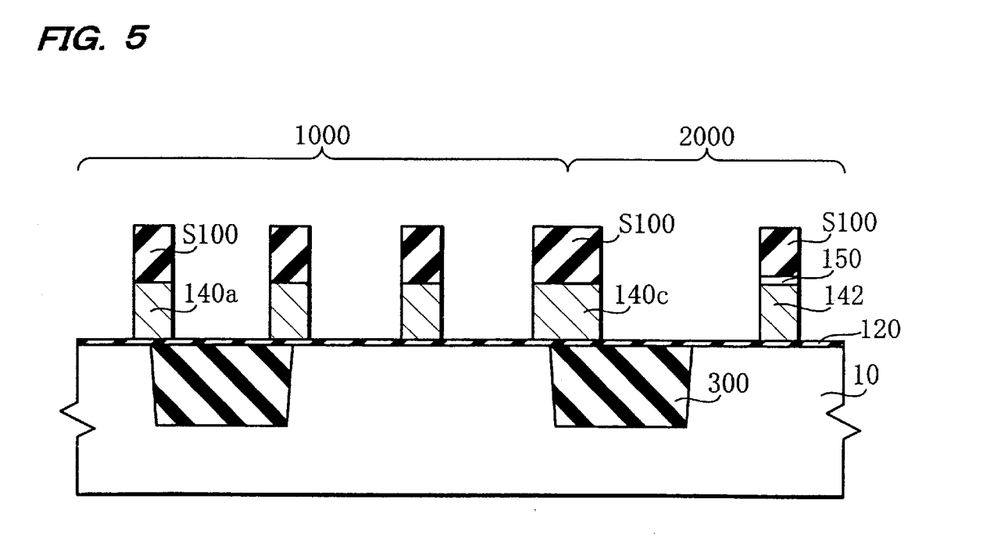
FIG. 5 is a cross-sectional view showing a step in the method of fabricating the semiconductor device shown in FIGS. 1 to 3.

(2) A resist layer (not shown) having a predetermined pattern is formed. The stopper layer S100 is then patterned using this resist layer as a mask. After that, the gate layer 140 is etched by using the patterned stopper layer S100 as a mask. Word gate layers 140a which become word gates after patterning described later are formed in the memory region 1000, as shown in FIG. 5. In the logic circuit region 2000, the gate electrode 142 of the MOS transistor is formed.

Specifically, a laminate consisting of the insulating layer 120, the word gate layer 140a, and the stopper layer S100 is formed in the memory region 1000 by this step. A laminate consisting of the insulating layer 120, the gate electrode 142, the mask insulating layer 150, and the stopper layer S100 is formed in the logic circuit region 2000. A laminate consisting of the boundary section 140c and the stopper layer S100 is formed on the element isolation region 300 which is the boundary between the memory region 1000 and the logic circuit region 2000.

Figure 6:
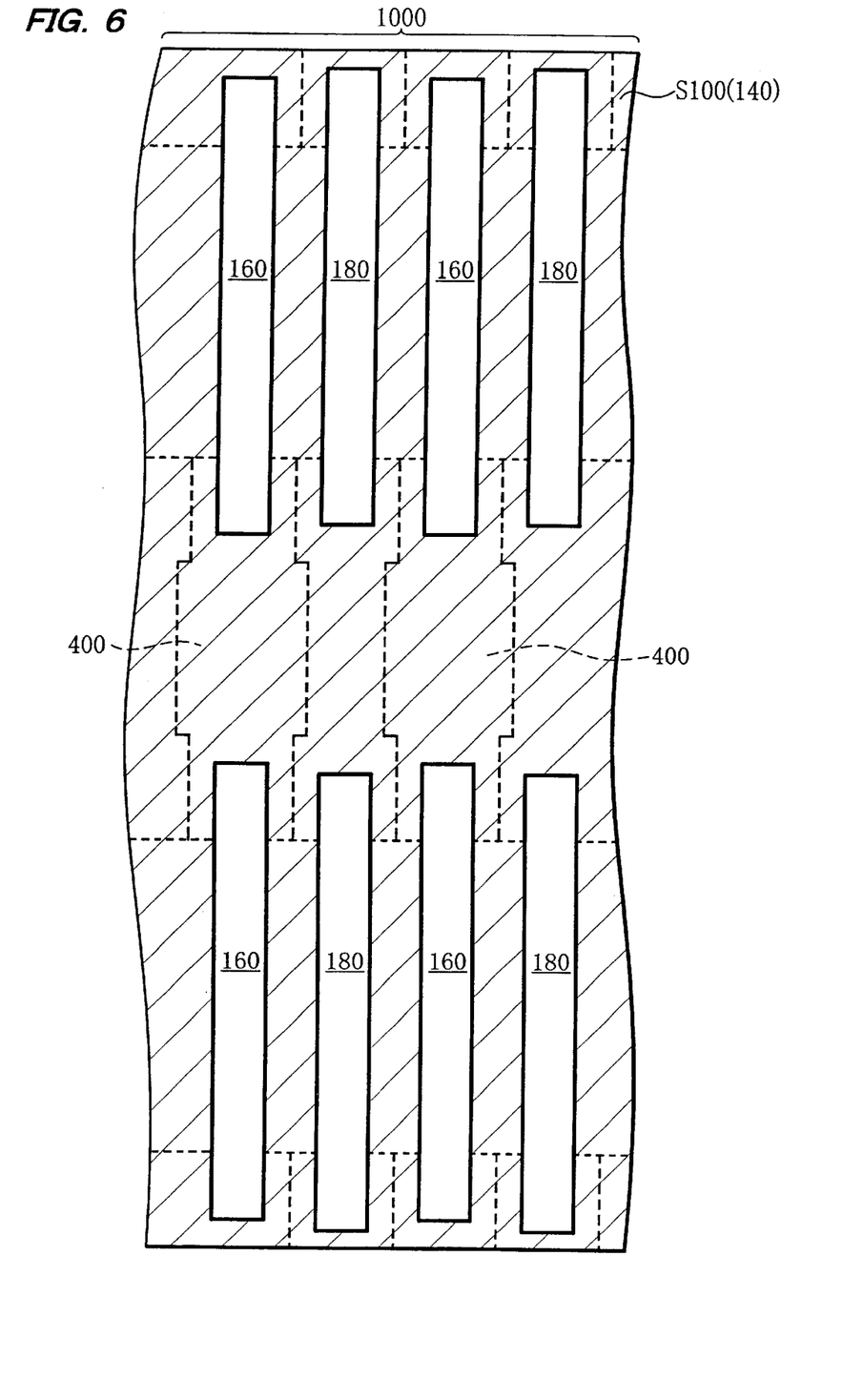
FIG. 6 is a plan view showing the step in the method of fabricating the semiconductor device shown in FIG. 5.

FIG. 6 is a plan view showing the memory region 1000 after the patterning. Openings 160 and 180 are formed in the laminate consisting of the gate layer 140 and the stopper layer S100 in the memory region 1000. The openings 160 and 180 approximately correspond to regions in which the impurity layers 16 and 18 are formed by ion implantation later. The side insulating layers and the control gates are formed along the sides of the openings 160 and 180 in a later step.

Figure 7:
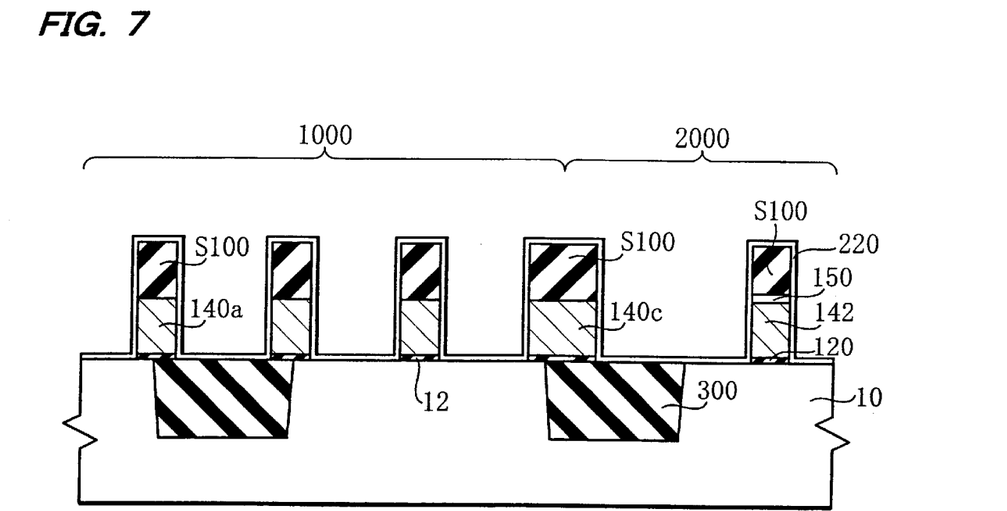
FIG. 7 is a cross-sectional view showing a step in the method of fabricating the semiconductor device shown in FIGS. 1 to 3.

(3) An ONO film 220 is formed over the entire surface of the semiconductor substrate 10, as shown in FIG. 7. The ONO film 220 is formed by depositing the first silicon oxide layer, the silicon nitride layer, and the second silicon oxide layer in that order. The first silicon oxide layer may be deposited by a thermal oxidation process, a chemical vapor deposition (CVD), or the like. The silicon nitride layer may be deposited by CVD or the like. The second silicon oxide layer may be deposited by CVD such as a high temperature oxidation (HTO) process. It is preferable to cause the deposited layers to be densified by annealing.

The ONO film 220 will be patterned in a later step, thereby forming the second gate insulating layers 22 and the side insulating layers 24 for the control gates 20 and 30, and the second contact insulating layer 210, as shown in FIG. 3.

Figure 8:
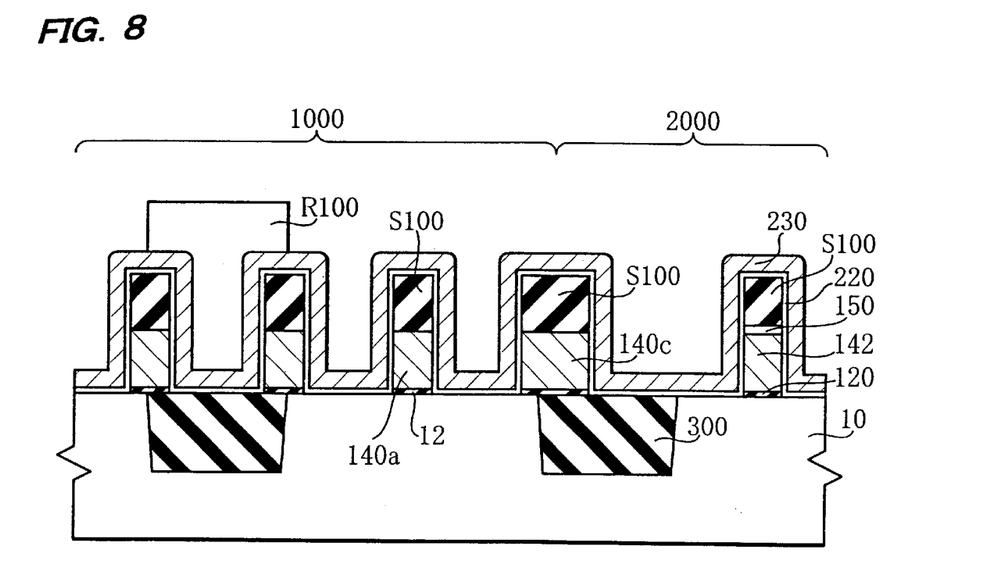
FIG. 8 is a cross-sectional view showing a step in the method of fabricating the semiconductor device shown in FIGS. 1 to 3.

(4) A doped polysilicon layer 230 is formed over the entire surface of the ONO film 220, as shown in FIG. 8. Resist layers R100 are then formed in regions in which the common contact sections are formed.

Figure 9:
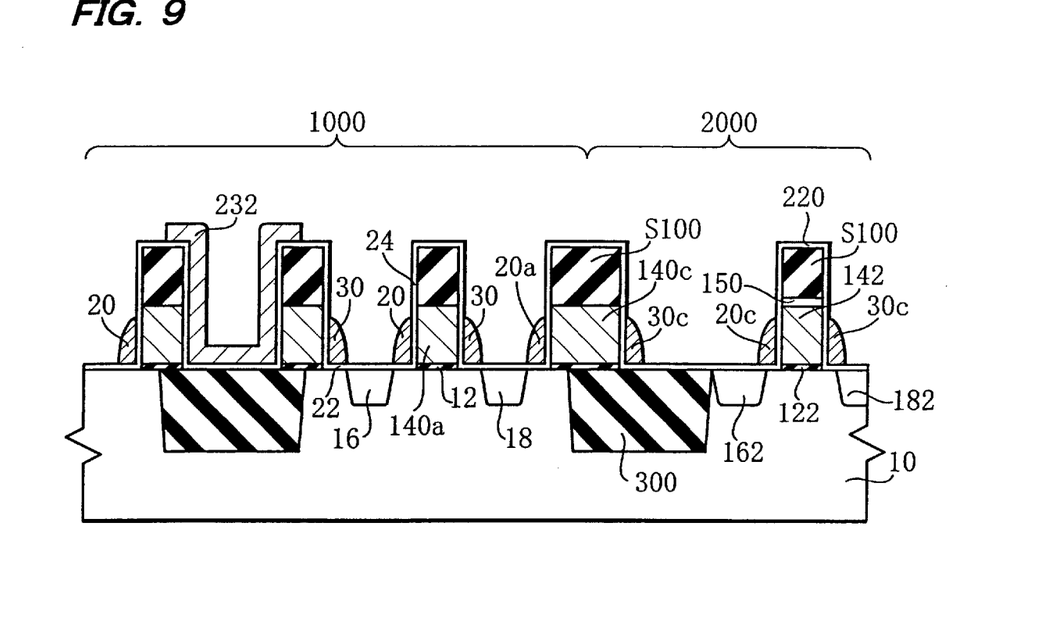
FIG. 9 is a cross-sectional view showing a step in the method of fabricating the semiconductor device shown in FIGS. 1 to 3.

(5) The entire surface of the doped polysilicon layer 230 (see FIG. 8) is anisotropically etched, thereby forming the conductive layers 40 (see FIG. 1) which form the first and second control gates 20 and 30 and the second contact conductive layers 232, as shown in FIG. 9. In this step, the conductive layers 20a and 30c in the shape of sidewalls are respectively formed on the sides of the boundary section 140c in the memory region 1000 and the logic circuit region 2000. The conductive layers 20c and 30c in the shape of sidewalls are also formed on either side of the gate electrode 142 in the logic circuit region 2000.

Specifically, the control gates 20 and 30 in the shape of sidewalls are formed on the second gate insulating layer 22 along the sides of the openings 160 and 180 (see FIG. 6) in the memory region 1000, with the side insulating layers 24 interposed therebetween. The control gates 20 and 30 are formed so that the upper ends thereof are located at a position lower than the upper surface of the word gate layer 140a. The second contact conductive layers 232 continuous with the control gates 20 and 30 are formed in the areas masked by the resist layers R100 (see FIG. 8) during this step. The resist layers R100 are then removed.

(6) The impurity layers 16 and 18 which form either a source region or a drain region in the memory region 1000, and the impurity layers 162 and 182 which form either a source region or a drain region in the logic circuit region 2000 are formed in the semiconductor substrate 10, by ion implantation of impurities such as N-type impurities, as shown in FIG. 9.

Figure 10:
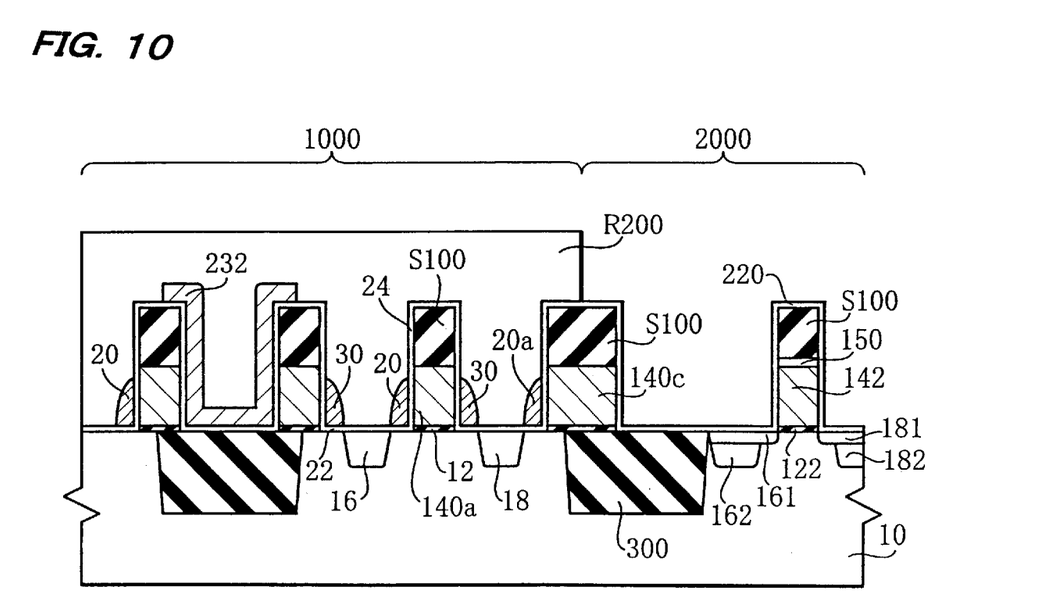
FIG. 10 is a cross-sectional view showing a step in the method of fabricating the semiconductor device shown in FIGS. 1 to 3.

(7) After masking the memory region 1000 by a resist layer R200, the conductive layers 20a and 30c (see FIG. 9) in the shape of sidewalls in the logic circuit region 2000 are removed, as shown in FIG. 10. The resist layer R200 is formed so that the end section thereof is located over the stopper layer S100 on the boundary section 140c.

(8) Extension layers 161 and 181 for a source region and a drain region are formed in the logic circuit region 2000 by doping the semiconductor substrate 10 with N-type impurities in a state in which the memory region 1000 is masked by the resist layer R200, as shown in FIG. 10. The resist layer R200 is then removed.

Figure 11:
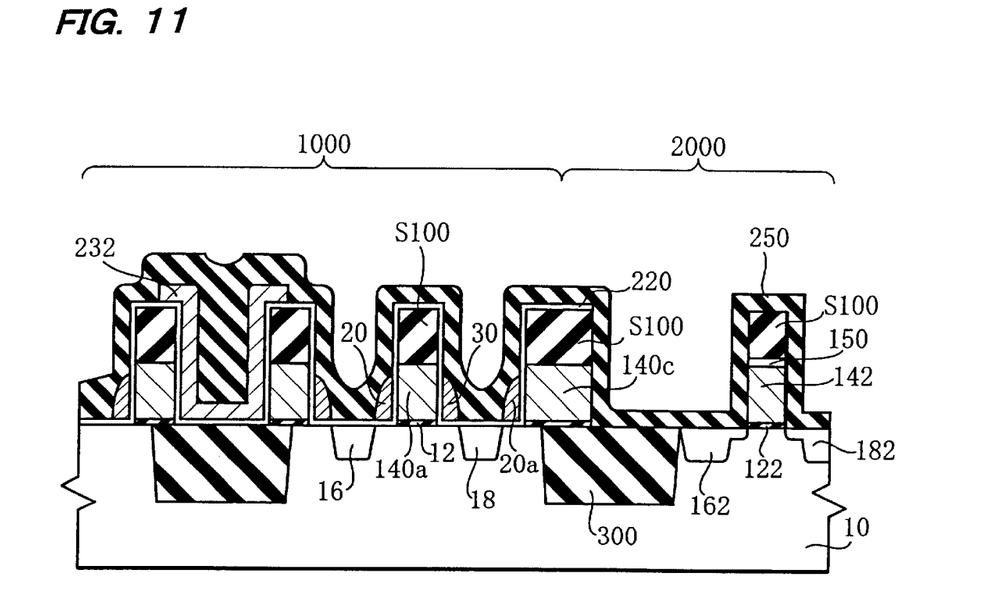
FIG. 11 is a cross-sectional view showing a step in the method of fabricating the semiconductor device shown in FIGS. 1 to 3.

(9) An insulating layer 250 formed of silicon oxide, silicon nitride oxide, or the like is provided over the entire surface of the memory region 1000 and the logic circuit region 2000, as shown in FIG. 11.

Figure 12:
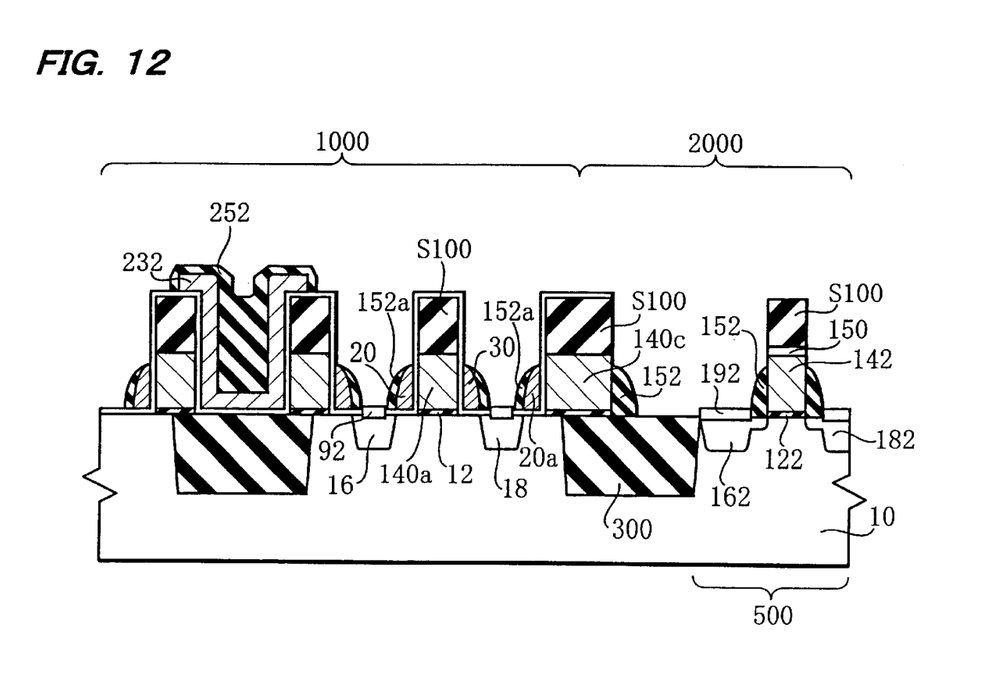
FIG. 12 is a cross-sectional view showing a step in the method of fabricating the semiconductor device shown in FIGS. 1 to 3.

The entire surface of the insulating layer 250 (see FIG. 11) is anisotropically etched, whereby the sidewall insulating layers 152 are formed on both sides of the gate electrode 142 in the logic circuit region 2000, as shown in FIG. 12. At the same time, the sidewall insulating layer 152 is also formed on one side of the boundary section 140c in the logic circuit region 2000, insulating layers 152a are formed on the control gates 20 and 30 and the conductive layer 20a, and the third contact insulating layer 252 is formed.

(10) Silicide layers are formed on the upper surfaces of the impurity layers 16, 18, 162, and 182, as shown in FIG. 12. First, a metal for forming a silicide is deposited over the entire surface. As examples of the metal for forming a silicide, titanium, cobalt and the like can be given. The metal formed on the impurity layers 16, 18, 162, and 182 is subjected to a silicidation reaction, thereby forming silicide layers 92 on the upper surfaces of the impurity layers 16 and 18 and forming silicide layers 192 on the upper surfaces of the impurity layers 162 and 182.

Therefore, the surface of either the source region or drain region of the MOS transistor 500 in the logic circuit region 2000 is self-alignably silicided during this silicidation step. The surface of either the source region or drain region of the memory cell 100 in the memory region 1000 is also self-alignably silicided during the same silicidation step.

The MOS transistor 500 is formed by these steps.

(11) The insulating layer 270 (see FIG. 13) of a material such as silicon oxide or silicon nitride oxide is formed over the entire surface of the memory region 1000 and the logic circuit region 2000. The insulating layer 270 is formed to cover the stopper layers S100.

Figure 13:
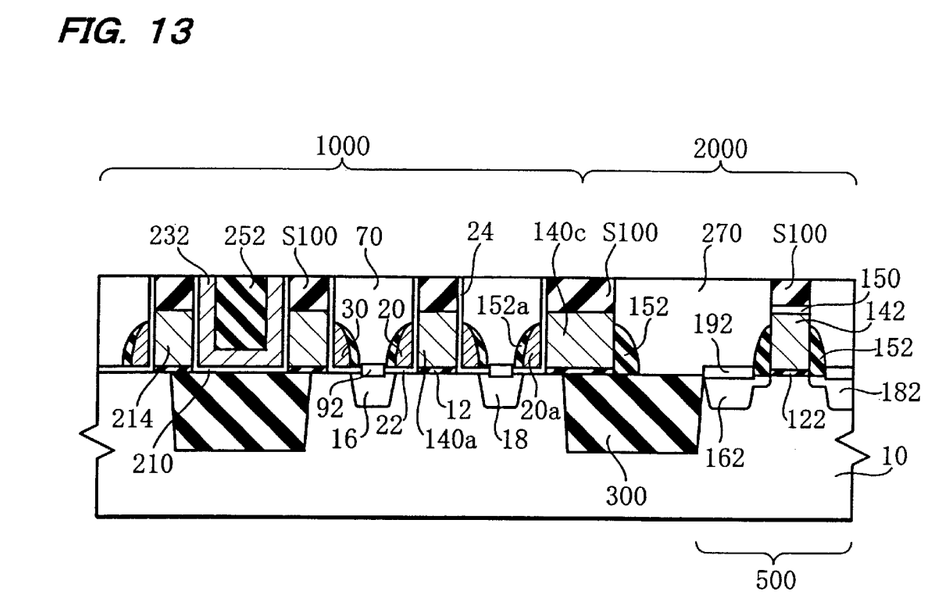
FIG. 13 is a cross-sectional view showing a step in the method of fabricating the semiconductor device shown in FIGS. 1 to 3.

The insulating layer 270 is then polished by CMP so that The stopper layers S100 are exposed, whereby the insulating layer 270 is planarized, as shown in FIG. 13.

The MOS transistor 500 is covered by the insulating layer 270 in the logic circuit region 2000. The mask insulating layer 150 and the stopper layer S100 are layered on the gate electrode 142 of the MOS transistor 500.

The buried insulating layer 70 is provided between the opposing side insulating layers 24 with the control gates 20 and 30 interposed therebetween. This step causes the first and second control gates 20 and 30 to be completely covered with the buried insulating layer 70 and exposes the second conductive layer 232.

Figure 14:
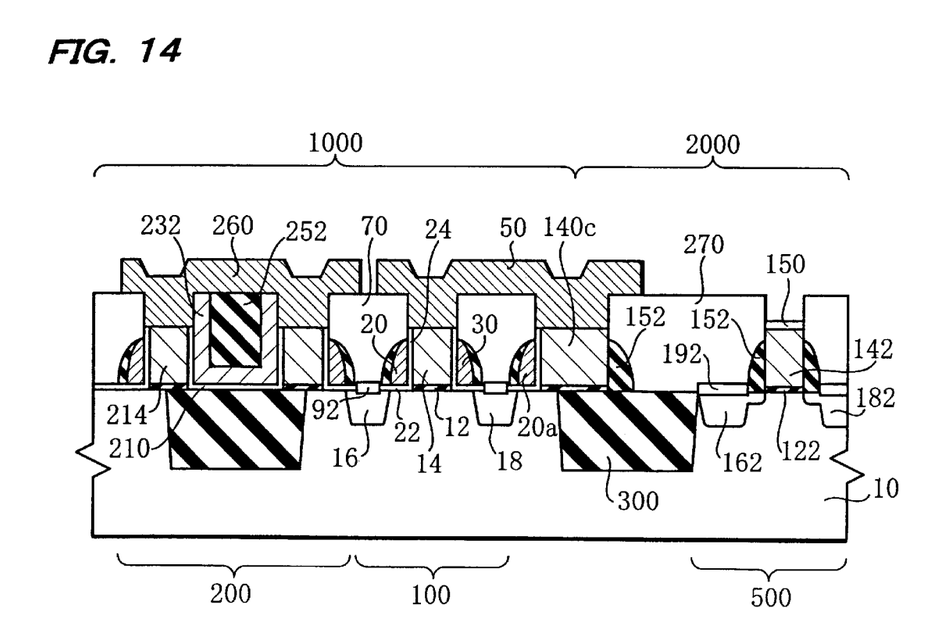
FIG. 14 is a cross-sectional view showing a step in the method of fabricating the semiconductor device shown in FIGS. 1 to 3.

(12) The stopper layers S100 (see FIG. 13) are removed by thermal phosphoric acid, for example, as shown in FIG. 14. A conductive layer such as a doped polysilicon layer is then formed in the memory region 1000 and the logic circuit region 2000. A resist layer (not shown) is then formed. The conductive layer is patterned by using this resist layer as a mask, thereby forming the word lines 50 and the third contact conductive layers 260. The gate layer 140a (see FIG. 13) is etched by using the same resist layer as a mask. The gate layer 140a is removed by this etching in regions which is not covered by the word lines 50. As a result, the word gates 14 arranged in a matrix can be formed. The regions in which the gate layers 140a is removed correspond to the regions in which the P-type impurity layers (element isolation impurity layers) 15 to be formed later (see FIG. 2).

In this etching step, the conductive layers 40 which form the first and second control gates 20 and 30 remain without being etched since the conductive layers 40 are covered with the buried insulating layers 70. The MOS transistor 500 in the logic circuit region 2000 is not affected by this etching since the MOS transistor 500 is completely covered with the insulating layer 270.

The entire surface of the semiconductor substrate 10 is doped with P-type impurities. This causes the P-type impurity layers (element isolation impurity layers) 15 (see FIG. 2) to be formed in regions between the word gates 14 adjacent to each other in the Y direction. The nonvolatile memory devices 100 can be isolated from one another more reliably by the P-type impurity layers 15.

(13) After forming a first interlayer dielectric, contact holes are formed by a conventional method, and conductive layers and interconnect layers are formed in the contact holes. For example, after forming the contact holes in the interlayer dielectric 72, the conductive layers 82 and the interconnect layers 80 connected with the common contact sections 200 are formed, as shown in FIG. 3. Contact sections and interconnect layers are similarly formed in the logic circuit region 2000 during this step.

The semiconductor device shown in FIGS. 1 to 3 is fabricated by these steps.

Advantages obtained by this fabrication method are as follows.

First, the word gate layer 140a which becomes the word gates 14 of the memory cells 100 and the gate electrodes 142 of the MOS transistors 500 can be formed in the same step (2).

Second, the source/drain regions 16 and 18 of the memory cells 100 and the source/drain regions 162 and 182 of the MOS transistors 500 can be formed in the same step (6).

Third, the silicide layers 92 formed on the source/drain regions 16 and 18 of the memory cells 100 and the silicide layers 192 formed on the source/drain regions 162 and 182 of the MOS transistors 500 can be formed in the same step (10).

Although one embodiment of the present invention has been described above, the present invention is not limited thereto, and various modifications can be made within the scope of the present invention. For example, a bulk semiconductor substrate is used as the semiconductor layer in the above embodiment. However, a semiconductor layer of an SOI substrate may be used instead.

What is claimed is:

1. A method of fabricating a semiconductor device including:

a memory region which has nonvolatile memory devices; and a logic circuit region which has a peripheral circuit for the nonvolatile memory devices, the method comprising the following steps in this order:

a step of forming a first insulating layer over a semiconductor layer;

a step of forming a first conductive layer over the first insulating layer;

a step of forming a mask insulating layer over part of the first conductive layer disposed within the logic circuit region;

a step of forming a stopper layer over the first conductive layer and the mask insulating layer;

a step of etching part of the stopper layer, the mask insulating layer and the first conductive layer to form word gate layers in the memory region and to form gate electrodes of insulated-gate field-effect transistors in the logic circuit region;

a step of forming an ONO film over the entire surface of the memory region and the logic circuit region;

a step of forming a second conductive layer over the ONO film;

a step of anisotropically etching the second conductive layer to form control gates in the shape of sidewalls at least on both sides of each of the word gate layers in the memory region with the ONO film interposed;

a step of forming first impurity layers each of which forms a source region or a drain region of the nonvolatile memory devices, and forming second impurity layers each of which forms a source region or a drain region of the insulated-gate field-effect transistors;

a step of forming sidewall insulating layers at least on both sides of the gate electrodes;

a step of forming silicide layers on the surfaces of the first impurity layers and the second impurity layers;

a step of forming a second insulating layer over the entire surface of the memory region and the logic circuit region;

a step of polishing the second insulating layer to expose the stopper layer;

a step of removing the stopper layer; and a step of patterning the word gate layers in the memory region to form word gates of the nonvolatile memory devices in the memory region.

2. The method of fabricating a semiconductor device as defined in claim 1, further comprising:

a step of forming an impurity layer for device isolation between the word gates adjacent to each other in a direction in which the first impurity layers extend, after forming the word gates.

3. A method of fabricating a semiconductor device including:

a memory region which has nonvolatile memory devices; and a logic circuit region which has a peripheral circuit for the nonvolatile memory devices, the method comprising the following steps in this order:

a step of forming a first insulating layer over a semiconductor layer;

a step of forming a first conductive layer over the first insulating layer;

a step of forming a mask insulating layer over part of the first conductive layer disposed within the logic circuit region;

a step of forming a stopper layer over the first conductive layer and the mask insulating layer;

a step of etching part of the stopper layer, the mask insulating layer and the first conductive layer to form word gate layers in the memory region and to form gate electrodes of insulated-gate field-effect transistors in the logic circuit region;

a step of forming an ONO film over the entire surface of the memory region and the logic circuit region;

a step of forming a second conductive layer over the ONO film;

a step of anisotropically etching the second conductive layer to make part of the second conductive layers remain on both sides of the word gate layers and the gate electrodes with the ONO film interposed;

a step of forming first impurity layers each of which forms a source region or a drain region of the nonvolatile memory devices, and forming second impurity layers each of which forms a source region or a drain region of the insulated-gate field-effect transistors;

a step of removing the second conductive layers remaining on both sides of the gate electrodes;

a step of forming a second insulating layer over the entire surface of the memory region and the logic circuit region;

a step of removing part of the second insulating layer so that part of the first and second impurity layers is exposed and the second conductive layers remaining in the memory region are not exposed;

a step of forming silicide layers on the surfaces of the first impurity layers and the second impurity layers;

a step of forming a third insulating layer over the entire surface of the memory region and the logic circuit region;

a step of polishing the third insulating layer to expose the stopper layer;

a step of removing the stopper layer; and a step of patterning the word gate layers in the memory region to form word gates of the nonvolatile memory devices in the memory region.

4. The method of fabricating a semiconductor device as defined in claim 3, further comprising:

a step of forming an impurity layer for device isolation between the word gates adjacent to each other in a direction in which the first impurity layers extend, after forming the word gates.

* * * * *